US008717829B2

(12) United States Patent
Sharma et al.

(10) Patent No.: US 8,717,829 B2
(45) Date of Patent: May 6, 2014

(54) SYSTEM AND METHOD FOR SOFT ERROR DETECTION IN MEMORY DEVICES

(75) Inventors: Ashish Sharma, New Delhi (IN); James B. Eifert, Austin, TX (US); Amit Kumar Gupta, Greater Noida (IN); Thomas W. Liston, Austin, TX (US); Jehoda Refaeli, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 190 days.

(21) Appl. No.: 13/532,804

(22) Filed: Jun. 26, 2012

(65) Prior Publication Data
US 2013/0343133 A1 Dec. 26, 2013

(51) Int. Cl.
*G11C 7/10* (2006.01)
(52) U.S. Cl.
USPC .................................. 365/189.05
(58) Field of Classification Search
None
See application file for complete search history.

(56) References Cited

U.S. PATENT DOCUMENTS

| | | | |
|---|---|---|---|
| 6,668,341 B1 | 12/2003 | Krauch | |
| 6,711,089 B2 * | 3/2004 | Ong | 365/51 |
| 6,711,703 B2 | 3/2004 | MacLaren et al. | |
| 7,482,831 B2 | 1/2009 | Chakraborty et al. | |
| 7,512,772 B2 | 3/2009 | Gschwind et al. | |
| 7,977,965 B1 | 7/2011 | Fleischer et al. | |
| 8,065,574 B1 | 11/2011 | Cheng | |
| 2010/0146369 A1 | 6/2010 | Joseph et al. | |

* cited by examiner

*Primary Examiner* — Hoai V Ho
*Assistant Examiner* — James G Norman
(74) *Attorney, Agent, or Firm* — Charles Bergere

(57) ABSTRACT

A system for detecting soft errors in a memory device includes a latch, a master flip-flop and a slave flip-flop. The latch receives input data (control and/or address signals) at the beginning of a memory operation in response to a rising edge of a first clock signal. The output of the latch is provided to the master flip-flop. The master flip-flop continuously receives and stores the latch output during the memory operation based on a second clock signal. The slave flip-flop receives and stores the output of the master flip-flop at the end of the memory operation based on the second clock signal. A comparator compares the input data with the output of the slave flip-flop to detect soft errors that occur during the memory operation.

19 Claims, 4 Drawing Sheets

SYSTEM AND METHOD FOR SOFT ERROR DETECTION IN MEMORY DEVICES

BACKGROUND OF THE INVENTION

The present invention relates generally to semiconductor memory devices and, more particularly, to soft error detection in semiconductor memory devices.

Radiation from charged particles, like alpha particles, can change the logic state of a storage element in an electronic device, thus introducing one or more soft errors that can result in incorrect or faulty operation of the electronic device. Detecting soft errors is difficult compared to detecting faults in a circuit design because the soft errors are temporary in nature and event-specific, i.e., they occur in the event of specific amounts of radiation. Although temporary and event specific, their detection is important, especially when the operation of the electronic device is critical. For example, electronic devices performing safety-critical operations, such as opening of air bags in an automobile, need to operate accurately in all circumstances.

Latches and memory cells store data values and hence are more prone to soft errors than combinational logic circuits. Memory cells are usually protected against charged particle hits by known methods that include radiation hardening. FIG. 1 is a schematic block diagram of a conventional memory device 100 that includes a ROM array 101, a plurality of latches 102, global and local control units 104 and 106, an address decoder (XDEC) 108, a memory array 110, a plurality of word lines 112 (two exemplary word lines are shown), bit units 114 and a data input/output (I/O) unit 116, for detecting soft errors in the memory device 100. The memory array 110 includes memory cells that are connected to the plurality of word lines 112.

To initiate a memory read/write operation on the memory device 100, the global control unit 104 generates address, control and data signals specifying the memory read/write operation. The latches 102 include address, control and data latches that latch the signal values and initiate the memory operation in the memory device 100. The XDEC 108 decodes the address value received from the address latch to enable an appropriate word line 112. The control latch provides the control signal to the local control unit 106. The data latch stores the data value input for a write operation and the data value output of a read operation. The bit unit 114 corresponding to the selected memory cell is controlled by the local control unit 106 for reading the value stored in the memory cell during the read operation. The data I/O unit 116 provides the value read from the bit unit 114 as the output of the read operation.

Soft errors typically alter one of the bits in the latches 102. The memory device 100 uses an error correction code (ECC) to detect and correct a one-bit error in the address and control values until they are latched by the latch 102. The ECC is also used to correct errors in the data. However, if the error occurs after the address and control values are latched by the latch 102, certain faults may occur in the memory operation, including failure in word line selection, selection of a wrong word line, incorrect selection of multiple word lines, and incorrect operation of the memory device 100 (i.e., write operation instead of a read operation and vice-versa).

The above-mentioned errors are not corrected with the ECC and hence the ROM array 101 is used to detect these failures. A bit-cell column of the ROM array 101 is placed near the memory array 110 to detect if no word line 112 is selected. The ROM array 101 also detects the selection of multiple word lines 112 using a differential voltage/current sensing circuit (not shown) that senses differential voltage/current of each word line 112. In addition, the ROM array 101 may include binary information of correct word lines 112 to detect the selection of a wrong word line 112. Upon incorrect selection of a word line 112, the ROM array 101 compares the wrongly selected word line 112 with a row address of the correct word line 112 to detect the soft error.

The complexity of the ROM array 101 makes the design of the memory device 100 very complex. Further, differential voltage/current sensing circuitry and additional timing circuitry are required for controlling the sensing of wrong word line 112 by the ROM array 101, which poses additional design challenges. The ROM array 101 and the differential voltage/current sensing and timing circuits also increase the chip area of the memory device 100. In addition, the ROM array 101 still fails to detect errors in control latches.

Therefore, there is a need for circuitry that accurately detects soft errors in memory devices including soft errors in address and control latches, that reduces complexity and chip area of a memory device, and that overcomes the above-mentioned disadvantages in existing memory devices.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

Figure 1:
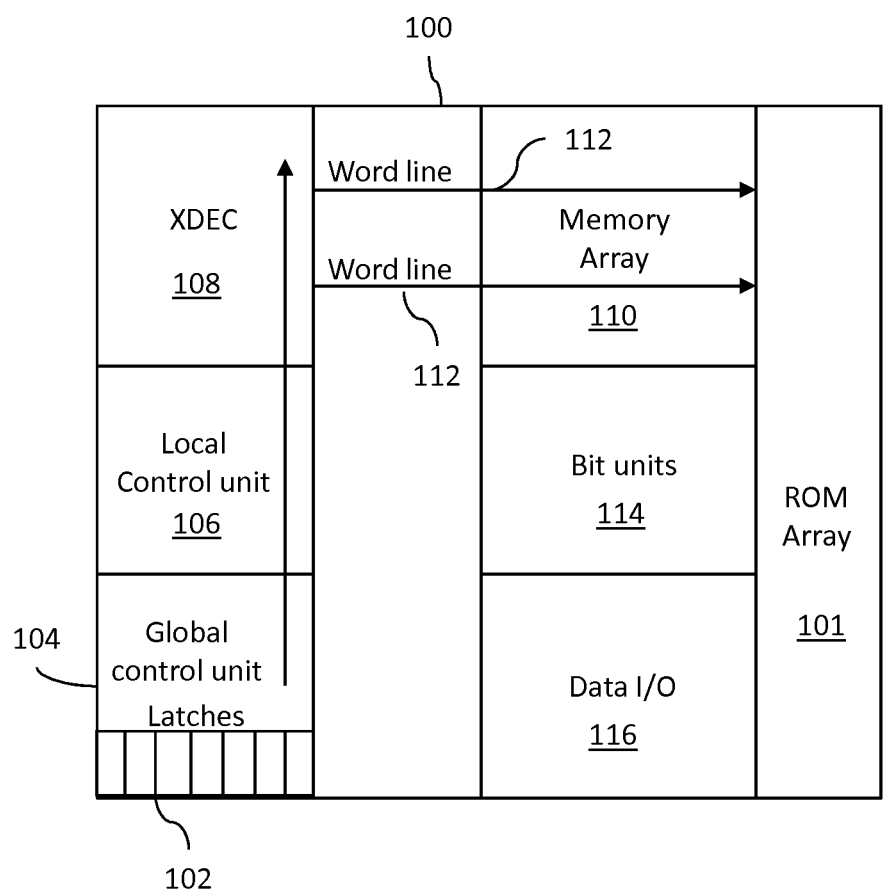
FIG. 1 is a schematic block diagram of a conventional memory device that uses a ROM array for detecting soft errors.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. In the description, the term multiplexer has been abbreviated as mux.

In an embodiment of the present invention, a system for detecting a soft error during a memory read/write operation in a memory device is provided. The system includes a latch, a master flip-flop and a slave flip-flop. The latch has a clock input terminal for receiving a first clock signal and an input terminal for receiving input data corresponding to the memory read/write operation. The latch latches the input data at the beginning of the memory read/write operation, in response to a rising edge of the first clock signal. The output of the latch is provided to the master flip-flop. The master flip-flop has a clock input terminal for receiving a second clock signal and an input terminal connected to the latch for receiving the latch output. The master flip-flop continuously receives and stores the latch output during the memory read/write operation, based on the second clock signal. The slave flip-flop has a clock input terminal for receiving the second clock signal and an input terminal connected to the master flip-flop for receiving the latch output. The slave flip-flop receives and stores the latch output at the end of memory read/write operation, based on the second clock signal. The output of the slave flip-flop is provided to a comparator. The comparator compares the latch output with the input data, to detect the soft error during the memory read/write operation.

In another embodiment of the present invention a memory device is provided. The memory device includes a plurality of latches, a master flip-flop, a slave flip-flop and a comparator. The latches include address and control latches that receive corresponding address and control signal values for a memory read/write operation at respective input terminals. The latches also include clock terminals for receiving a first clock signal. The address and control latches latch the address and control signal values at the beginning of the memory read/write operation, in response to a rising edge of the first clock signal. The output of the latches is provided to the master flip-flop. The master flip-flop has a clock input terminal for receiving a second clock signal and an input terminal for receiving the latch output. The master flip-flop continuously receives and stores the latch output during the memory read/write operation, based on the second clock signal. The slave flip-flop has a clock input terminal for receiving the second clock signal and an input terminal for receiving the latch output from the master flip-flop. The slave flip-flop receives and stores the latch output at the end of memory read/write operation, based on the second clock signal. The comparator receives the latch output from the slave flip-flop and compares the latch output with the input address and control signal values, to detect the soft error during the memory read/write operation.

In yet another embodiment of the present invention, a method for detecting a soft error during a memory read/write operation in a memory device is provided. A latch receives input data corresponding to the memory read/write operation at the beginning thereof. The latch latches the input data in response to a rising edge of a first clock signal. The output of the latch is continuously received at a master flip-flop during the memory read/write operation, based on a second clock signal. The master flip-flop stores the output of the latch during the memory read/write operation. The stored value of the latch output is provided to a slave flip-flop at the end of the memory read/write operation, based on the second clock signal. The slave flip-flop provides the latch output to a comparator. The comparator compares the latch output with the input data by a comparator, to detect the soft error during the memory read/write operation.

Various embodiments of the present invention provide a system and method for detecting a soft error during a memory read/write operation in a memory device. The memory device includes a master flip-flop that receives and stores input address and control signal values latched by address and control latches of the memory device (i.e., the latch output), during the memory read/write operation and a slave flip-flop receives and stores the latch output at the end of the memory read/write operation. The comparator receives the output of the slave flip-flop and compares it with the input address and control signal values, to accurately detect soft errors. The memory device of the present invention uses master and slave flip-flops that are a part of scan flip-flops used in scan chain circuits of the memory device and hence does not require additional differential voltage/current sensing and timing circuits, and a ROM array for detecting soft errors. Thus, the design complexities and chip area of the memory device are reduced.

Figure 2:
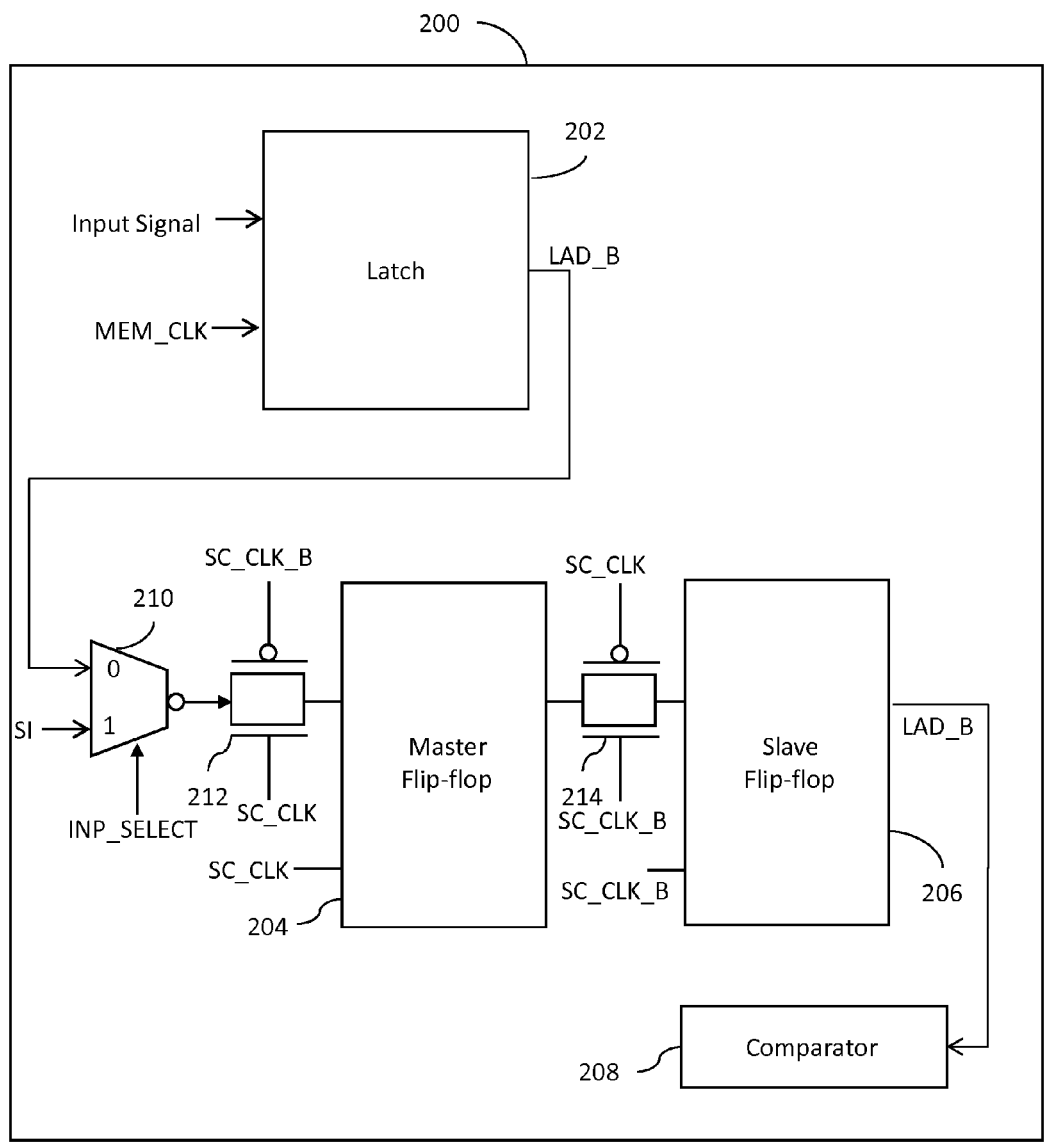
FIG. 2 is a schematic block diagram of a circuit that detects soft errors in a memory device in accordance with an embodiment of the present invention.

Referring now to FIG. 2, a schematic block diagram of a memory device 200, in accordance with an embodiment of the present invention, is shown. Examples of the memory device 200 include random access memories (RAMs), read only memories (ROMs), dynamic-RAMs (DRAMs), static-RAMs (SRAMs), and flash memories. The memory device 200 includes a latch 202, a master flip-flop 204, a slave flip-flop 206 and a comparator 208. It will be understood by a skilled artisan that the memory device 200 also includes a memory array, an address decoder (XDEC), word and bit lines, global and local control units, bit units and data input/output (I/O) units (not shown in FIG. 2), the functioning of which is similar to the corresponding elements of the memory device 100 of FIG. 1. The latch 202 may be an address latch and a control latch. In various embodiments of the present invention, the master and slave flip-flops 204 and 206 may be scan flip-flops that are a part of scan chain circuits (not shown) of the memory device 200, and further include a mux 210 and first and second transmission gates 212 and 214.

Figure 3:
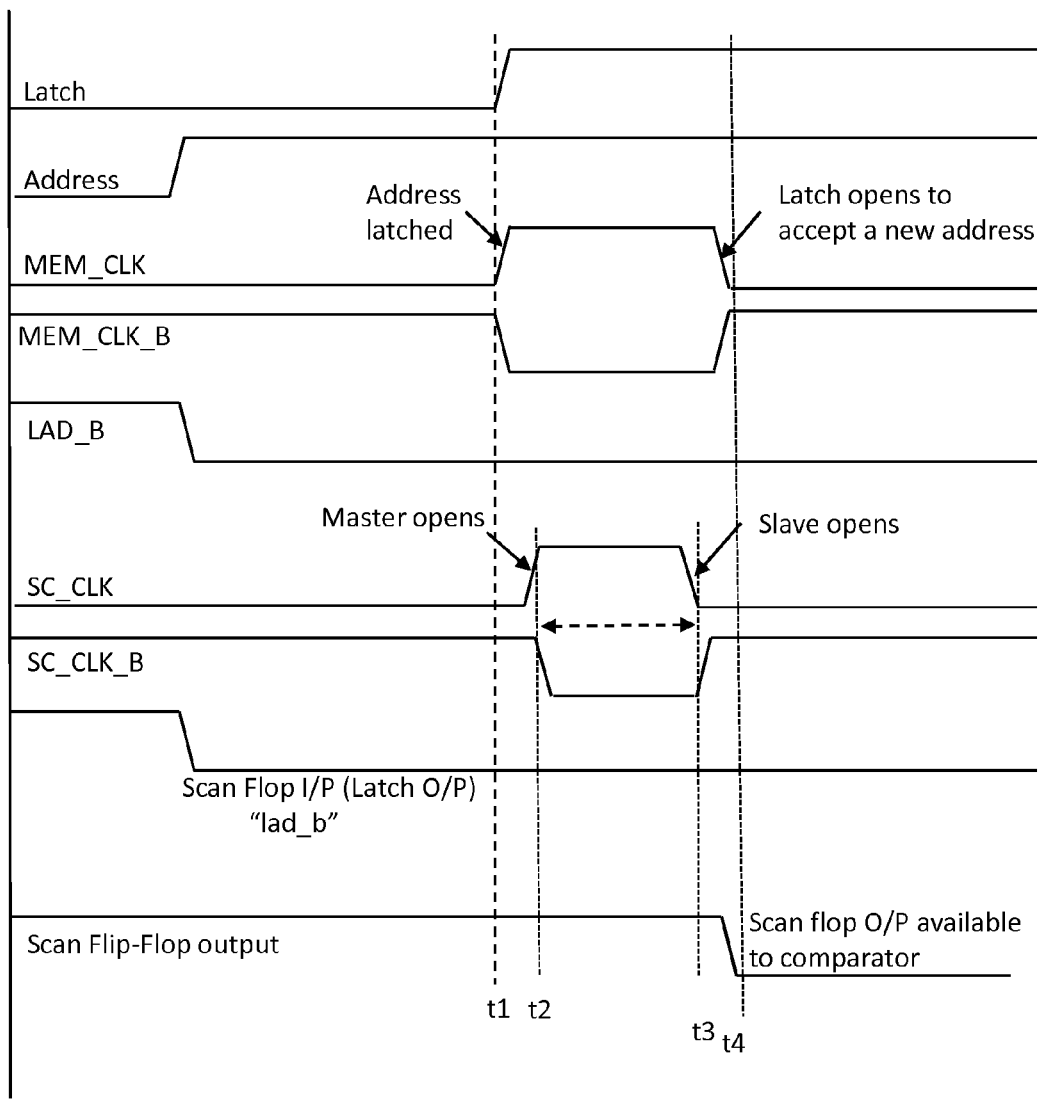
FIG. 3 is a timing diagram of various signals in the circuit of FIG. 2, in accordance with an embodiment of the present invention.

FIG. 3 shows timing diagrams of various signals of the memory device 200. FIG. 2 has been described in conjunction with the timing diagrams illustrated in FIG. 3. The latch 202 is configured to receive input signal values, i.e., input address or control signal values (referred to as the input signal) depending on whether the latch 202 is an address or a control latch at an input terminal, respectively. The latch 202 further receives a first clock signal (or a memory clock signal, MEM_CLK) and latches the input signal values at a positive edge of the MEM_CLK signal. The MEM_CLK signal is the global clock used in the memory device 200. As shown in FIG. 3, the latch 202 latches the input signal value at time 't1' in response to a rising edge of the MEM_CLK signal. The rising edge of the MEM_CLK signal represents the beginning of a memory read/write operation.

The output of the latch 202, i.e., output signal LAD_B, is provided to the master flip-flop 204 by way of the mux 210. The mux 210 receives the LAD_B signal values at a first input terminal, a scan input (SI) signal at a second input terminal and a select signal (INP_SELECT) at a select terminal thereof. Based on INP_SELECT signal, the mux 210 selects the LAD_B signal at the first input terminal (when the memory device 200 is functioning) and the SI signal during scan chain testing of the memory device 200. Since scan chain testing is beyond the scope of the present invention, further description of it is omitted so as not to obfuscate the present description.

The first transmission gate 212 is connected between an output terminal of the mux 210 and the master flip-flop 204 and is controlled by a second clock signal or scan clock signal, SC_CLK. The SC_CLK signal is a derivative of the MEM_CLK signal and is synchronized with the MEM_CLK signal, as shown in FIG. 3. The first transmission gate 212 opens at time 't2' in response to a rising edge of the SC_CLK signal during the memory read/write operation, and provides the LAD_B signal values to the master flip-flop 204. The first transmission gate 212 closes at time 't3' in response to a falling edge of the SC_CLK signal. An input terminal of the master flip-flop 204 is connected to an output terminal of the mux 210, by way of the first transmission gate 212. The master flip-flop 204 operates on the SC_CLK signal received at a clock terminal thereof and continuously receives and latches the LAD_B signal values from time period 't2' to 't3', i.e., till the SC_CLK signal remains high.

The second transmission gate 214 opens at time 't3' in response to the falling edge of the SC_CLK signal, which indicates that the memory device 200 is reset and ready for a next memory read/write operation at the next positive edge of the MEM_CLK signal. The slave flip-flop 206 operates on an inverted scan clock signal (SC_CLK_B) received at a clock terminal thereof. An input terminal of the slave flip-flop 206 is connected to an output terminal of the master flip-flop 204, by way of the second transmission gate 214. The slave flip-flop 206 receives and latches the LAD_B signal values from the master flip-flop 204 at the input terminal at time 't3'. The second transmission gate 214 opens at time 't3', which indicates the end of the memory operation, in response to a rising edge (not shown) of the SC_CLK signal. At time 't4', the output of the slave flip-flop 206, i.e., the LAD_B signal values, is provided to the comparator 208. The comparator 208 compares the LAD_B signal values with the input address and control signal values. The difference represents soft errors that occur during the memory read/write operation.

Figure 4:
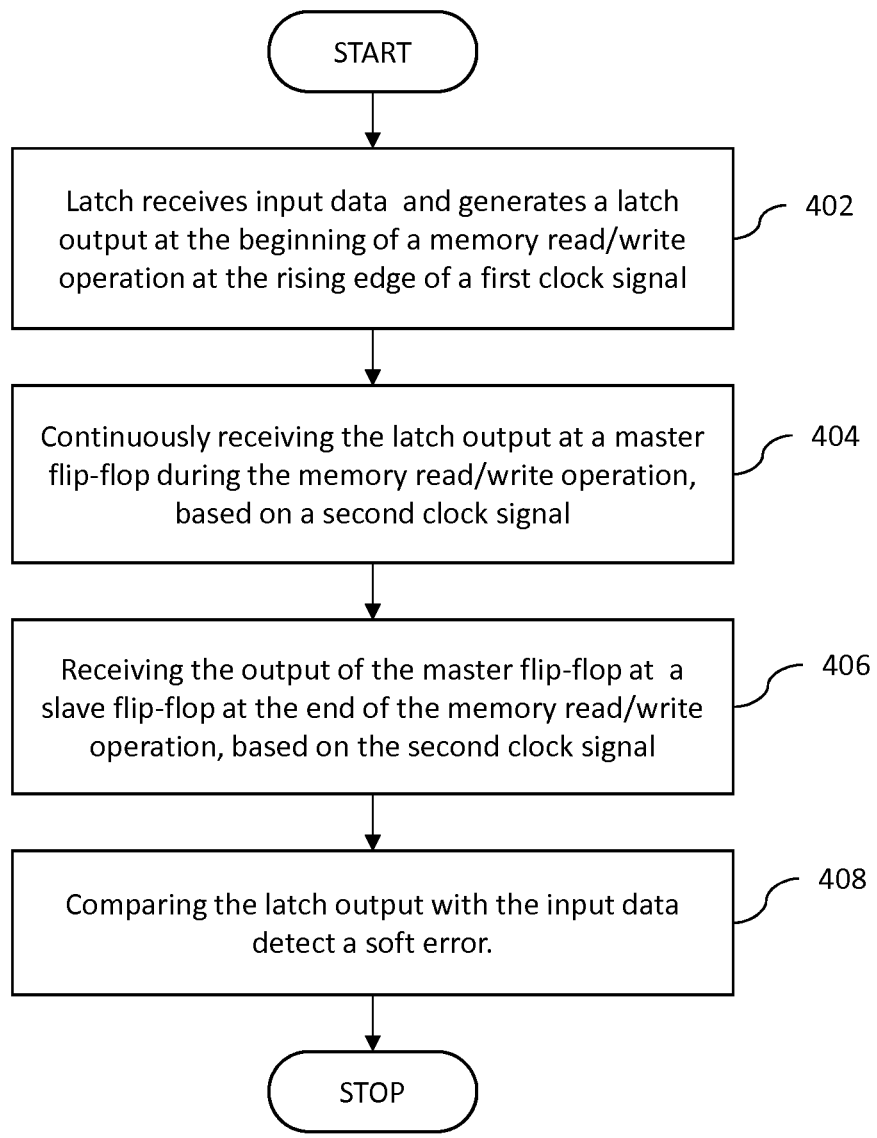
FIG. 4 is a flow chart illustrating a method for detecting soft errors in a memory device in accordance with an embodiment of the present invention.

Referring now to FIG. 4, a flow chart illustrating a method for detecting soft errors in the memory device 200 in accordance with an embodiment of the present invention, is shown. Steps of the flow chart are explained in conjunction with FIGS. 2 and 3. At step 402, the latch 202 receives the input signal values, i.e., input address or control signal values, to generate the LAD_B signal, in response to a rising edge of the MEM_CLK signal, at the beginning of the memory read/write operation. At step 404, the master flip-flop 204 continuously receives the LAD_B signal values during the memory read/write operation (from time 't2' to 't3' as shown in FIG. 3), based on the SC_CLK signal. At step 406, the slave flip-flop 206 receives the LAD_B signal values from the master flip-flop 204, in response to the falling edge of the SC_CLK signal (time 't3'). At step 408, the latched LAD_B signal values received at an output terminal of the slave flip-flop 206 at time 't4' are compared with the input signal values by the comparator 208, to detect the soft errors that occur during the memory read/write operation.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for detecting a soft error in a memory device during a memory read/write operation, comprising:
   a latch having a clock input terminal for receiving a first clock signal and a data input terminal for receiving input data corresponding to the memory read/write operation, wherein the latch latches the input data at the beginning of the memory read/write operation in response to a rising edge of the first clock signal and generates a latch output;
   a master flip-flop having a clock input terminal for receiving a second clock signal and a data input terminal connected to the latch for receiving the latch output, wherein the master flip-flop continuously receives and stores the latch output during the memory read/write operation based on the second clock signal;
   a slave flip-flop having a clock input terminal for receiving the second clock signal and an input terminal connected to an output of the master flip-flop for receiving the latch output, wherein the slave flip-flop receives and stores the latch output at the end of memory read/write operation based on the second clock signal; and
   a comparator, having a first input that receives the input data and a second input connected to an output of the slave flip-flop for receiving the latch output therefrom, for comparing the input data and the latch output and thereby detecting a soft error during the memory read/write operation.

2. The system of claim 1, wherein the first and second clock signals are synchronized.

3. The system of claim 1, wherein the master flip-flop includes a first switch that receives the second clock signal for and enables the master flip-flop at a rising edge of the second clock signal and disables the master flip-flop at a falling edge of the second clock signal.

4. The system of claim 3, wherein the slave flip-flop includes a second switch that receives the second clock signal and enables the slave flip-flop at the falling edge of the second clock signal and disables the slave flip-flop at the rising edge of the second clock signal.

5. The system of claim 1, wherein the master and slave flip-flops comprise scan flip-flops and are part of a scan chain circuit of the memory device.

6. The system of claim 1, wherein the latch comprises at least one of an address latch and a control latch.

7. The system of claim 1, wherein the input data includes at least one of address and control signal values corresponding to the memory read/write operation.

8. The system of claim 1, wherein the memory device comprises at least one of a random access memory (RAM), read only memory (ROM), dynamic-RAM (DRAM), static-RAM (SRAM), and flash memory.

9. A memory device, comprising:
   a plurality of latches comprising address and control latches, wherein the address and control latches receive corresponding address and control signals corresponding to a memory read/write operation, at respective input terminals and a first clock signal at respective clock terminals, latch the address and control signals at the beginning of the memory read/write operation in response to a rising edge of the first clock signal and generate latch outputs;
   a plurality of master flip-flops corresponding to the plurality of latches, wherein each master flip-flop has a clock input terminal for receiving a second clock signal and an input terminal connected to an output of a corresponding latch for receiving the latch output, wherein the master flip-flop continuously receives and stores the latch output during the memory read/write operation based on the second clock signal;
   a plurality of slave flip-flops connected to corresponding plurality of master flip-flops, wherein each slave flip-flop has a clock input terminal for receiving the second clock signal and an input terminal connected to an output of a corresponding master flip-flop for receiving the latch output, wherein the slave flip-flop receives and stores the latch output at the end of a memory read/write operation based on the second clock signal; and
   a comparator having first inputs that receive the address and control signals and second inputs connected to outputs of the plurality of slave flip-flops for receiving the latch outputs therefrom and comparing the latch outputs with the address and control signals to detect soft errors during the memory read/write operation.

10. The memory device of claim 9, wherein the first and second clock signals are synchronized.

11. The memory device of claim 9, wherein each master flip-flop includes a first switch that receives the second clock signal and enables the master flip-flop at a rising edge of the second clock signal and disables the master flip-flop at a falling edge of the second clock signal.

12. The memory device of claim 11, wherein each slave flip-flop includes a second switch that receives the second clock signal and enables the slave flip-flop at the falling edge of the second clock signal and disables the slave flip-flop at the rising edge of the second clock signal.

13. The memory device of claim 9, wherein the master and slave flip-flops comprise scan flip-flops and are part of a scan chain circuit of the memory device.

14. The memory device of claim 9, wherein the memory device comprises at least one of a random access memory (RAM), read only memory (ROM), dynamic-RAM (DRAM), static-RAM (SRAM), and flash memory.

15. A method for detecting a soft error during a memory read/write operation in a memory device, comprising:

receiving input data corresponding to the memory read/write operation by a latch at the beginning of the memory read/write operation, in response to a rising edge of a first clock signal, wherein the latch latches the input data and generates a latch output;

continuously receiving the latch output at a master flip-flop during the memory read/write operation, based on a second clock signal, wherein the master flip-flop stores the latch output;

receiving the latch output at a slave flip-flop from the master flip-flop, at the end of the memory read/write operation, based on the second clock signal, wherein the slave flip-flop stores the latch output; and comparing the latch output with the input data by a comparator, to detect the soft error during the memory read/write operation.

16. The method of claim 15, wherein the first and second clock signals are synchronized.

17. The method of claim 15, further comprising enabling the master flip-flop at a rising edge of the second clock signal and disabling the master flip-flop at a falling edge of the second clock signal.

18. The method of claim 17, further comprising enabling the slave flip-flop at the falling edge of the second clock signal and disabling the slave flip-flop at the rising edge of the second clock signal.

19. The method of claim 15, wherein the input data includes at least one of address and control signal values corresponding to the memory read/write operation.

* * * * *